(12) United States Patent
Grivna et al.

(10) Patent No.: US 8,021,947 B2
(45) Date of Patent: Sep. 20, 2011

(54) METHOD OF FORMING AN INSULATED GATE FIELD EFFECT TRANSISTOR DEVICE HAVING A SHIELD ELECTRODE STRUCTURE

(75) Inventors: Gordon M. Grivna, Mesa, AZ (US); James Sellers, Chandler, AZ (US); Prasad Venkatraman, Gilbert, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 93 days.

(21) Appl. No.: 12/633,947

(22) Filed: Dec. 9, 2009

(65) Prior Publication Data
US 2011/0136309 A1    Jun. 9, 2011

(51) Int. Cl.
*H01L 21/336* (2006.01)
(52) U.S. Cl. ........ 438/270; 438/268; 438/495; 438/508; 257/330; 257/E21.41; 257/E21.211
(58) Field of Classification Search .................. None
See application file for complete search history.

(56) References Cited

U.S. PATENT DOCUMENTS

| | | | |
|---|---|---|---|
| 4,455,565 A | 6/1984 | Goodman et al. | |
| 4,941,026 A | 7/1990 | Temple | |
| 5,763,915 A | 6/1998 | Hshieh et al. | |
| 5,877,528 A | 3/1999 | So | |
| 5,912,490 A | 6/1999 | Herbert et al. | |
| 5,998,833 A | 12/1999 | Baliga | |
| 6,388,286 B1 | 5/2002 | Baliga | |
| 6,621,121 B2 | 9/2003 | Baliga | |
| 6,764,889 B2 | 7/2004 | Baliga | |
| 6,787,848 B2 | 9/2004 | Ono et al. | |
| 7,005,347 B1 | 2/2006 | Bhalla et al. | |
| 7,183,610 B2 | 2/2007 | Pattanayak et al. | |
| 2005/0242392 A1 | 11/2005 | Pattanayak et al. | |
| 2006/0273386 A1 | 12/2006 | Yilmaz et al. | |
| 2008/0197407 A1 | 8/2008 | Challa et al. | |

FOREIGN PATENT DOCUMENTS

| | | |
|---|---|---|
| WO | 2005/053031 A2 | 6/2005 |
| WO | 2005/053032 A2 | 6/2005 |
| WO | 2005/112128 A2 | 11/2005 |

OTHER PUBLICATIONS

Ishikawa and Esaki, A High-Power High-Gain VD-MOSFET Operating at 900 MHz, IEEE Transactios on Electron Devices, vol. ED-34, No. 5, pp. 1157-1162, May 1987.

*Primary Examiner* — Zandra Smith
*Assistant Examiner* — Khanh Duong
(74) *Attorney, Agent, or Firm* — Kevin B. Jackson

(57) ABSTRACT

In one embodiment, a method for forming a transistor having insulated gate electrodes and insulated shield electrodes within trench regions includes forming disposable dielectric stack overlying a substrate. The method also includes forming the trench regions adjacent to the disposable dielectric stack. After the insulated gate electrodes are formed, the method includes removing the disposable dielectric stack, and then forming spacers adjacent the insulated gate electrodes. The method further includes using the spacers to form recessed regions in the insulated gate electrodes and the substrate, and then forming enhancement regions in the first and second recessed regions.

22 Claims, 9 Drawing Sheets

METHOD OF FORMING AN INSULATED GATE FIELD EFFECT TRANSISTOR DEVICE HAVING A SHIELD ELECTRODE STRUCTURE

FIELD OF THE INVENTION

This document relates generally to electronics, and more particularly, to methods of forming semiconductor devices.

BACKGROUND OF THE INVENTION

In the past, the semiconductor industry used different device structures and methods to form insulated gate field effect transistor (IGFET) devices. One particular structure for vertical power IGFET devices used trenches that were formed in an active area of the device. A portion of those trenches were configured as the gate regions of the device. Some of these transistors also had a shield conductor or field plate that was tied to source and configured to assist in improving blocking voltage performance and lowering the gate-to-drain capacitance of the device.

In order for the field plate to favorably impact device performance, very tight geometries are required. Past methods for forming IGFET devices with trench field plates relied on a complex series of process steps, and used thick oxidation layers overlying the trench gate regions to form self-aligned source and body contacts. These thick oxidation layers prevented the use of gate silicide structures, and required the use of thicker epitaxial layers, deeper trenches, and deeper etched contacts. All of these factors reduced the overall manufacturability of the device.

Accordingly, it is desirable to have a scaleable, self-aligned process for forming the device structure, which results in better device performance, reliability, and lower costs.

Figure 1:
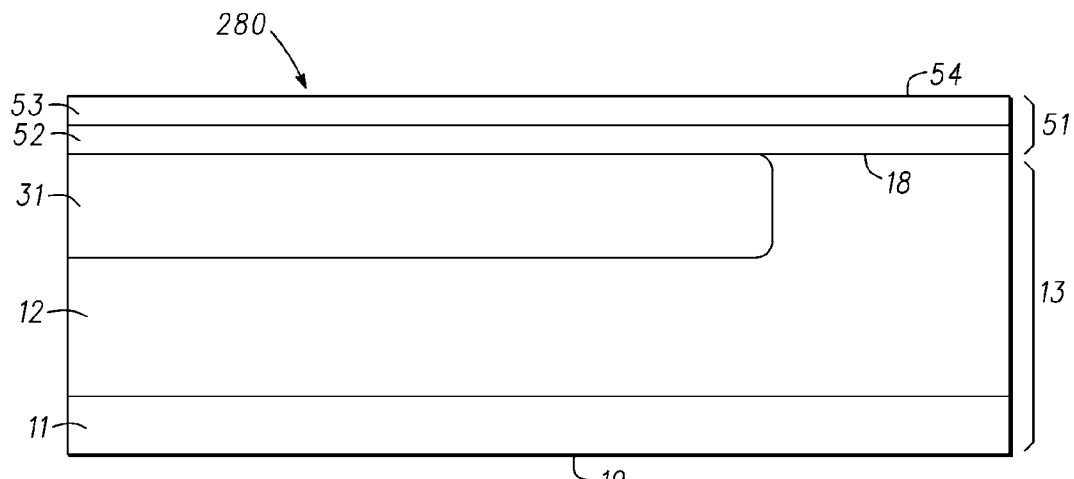
FIGS. 1-8 illustrate partial cross-sectional views of a first embodiment of an IGFET device at early and successive stages of fabrication.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the present invention. The use of the word approximately or substantially means that a value of an element has a parameter that is expected to be very close to a stated value or position or state. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, although the source is normally shown on the top or upper surface of the device and the drain is normally shown on the bottom or lower surface of the device, such orientation is reversible. Additionally, the drain and source contacts may be on the same or opposite surfaces.

Moreover, the description may illustrate a cellular design (where the body regions are a plurality of cellular regions) or a single body design (where the body region is comprised of a single region formed in an elongated pattern, typically in a serpentine pattern or formed in a plurality of stripes). However, it is intended that the description is applicable to both a cellular implementation and a single base implementation.

DETAILED DESCRIPTION OF THE DRAWINGS

In general, the present description pertains to a method of forming an IGFET semiconductor device or transistor having trench insulated gate electrode and trench insulated shield electrode portions. A disposable dielectric stack is used when forming the trench structures, and spacer structures are used when forming one or more enhancement regions in a self-aligned or partial self-aligned manner.

In one embodiment, the method provides a transistor with an insulated shield electrode portion that is wider or has a larger lateral dimension than the insulated gate electrode portion. In another embodiment, the insulated shield electrode portion and the insulated gate electrode portion have similar widths or lateral dimensions.

The method enables trench structures that are shallower than prior art structures, enables the use of thinner epitaxial layers, enables the use of gate silicide enhancement regions, and enables smaller geometry configurations without expensive capital investments. Additionally, the method provides a transistor that is easier to manufacture and that has improved performance and reliability.

FIG. 1 shows a partial cross-sectional view of a first embodiment of an IGFET, MOSFET, or transistor 10 at an early step in fabrication. Transistor 10 is formed on or within a body of semiconductor material, semiconductor substrate or substrate 13. In one embodiment, semiconductor substrate 13 includes a bulk semiconductor substrate or bulk substrate 11 that has an epitaxial layer or drift region 12 formed overlying or adjoining one surface of bulk substrate 11. In one embodiment, bulk substrate 11 comprises an n-type silicon substrate having a resistivity in a range from about 0.001 ohm-cm to about 0.005 ohm-cm. In one embodiment, bulk substrate 11 provides a drain contact or a current-carrying contact for transistor 10. Semiconductor substrate 13 includes major surfaces 18 and 19, which oppose each other as shown in FIG. 1.

In one embodiment suitable for a 50 volt device, semiconductor layer 12 is n-type with a dopant or doping concentration of about $1.0 \times 10^{16}$ to $1.0 \times 10^{17}$ atoms/cm$^3$ and has a thickness from about 3 microns to about 5 microns. In another embodiment, semiconductor layer 12 may have a graded or stepped doping profile, where the doping concentration is heavier near the bottom of layer 12, and becomes lighter near the top. The thickness and dopant concentration of semiconductor layer 12 is increased or decreased depending on the desired drain-to-source breakdown voltage (BV$_{DSS}$) rating of transistor 10. It is understood that other materials may be used for semiconductor substrate 13 or portions thereof (e.g., portions of semiconductor layer 12 and/or portions of bulk substrate 11) including silicon-germanium, silicon-germanium-carbon, carbon-doped silicon, silicon carbide, semiconductor-on-insulator (SOI), or the like. Additionally, in an alternate embodiment, the conductivity type of bulk substrate 11 or a portion thereof is switched to be opposite the conductivity type of semiconductor layer 12 to form, for example, an insulated gate bipolar transistor (IGBT) embodiment.

FIG. 1 further shows a body region or p-type high voltage (PHV) region 31 formed in an active portion 280 of semiconductor substrate 13. As described herein, body region 31 is referred to in the singular, but it is understood that the body region may be a plurality of individual regions or cells. Body region 31 has a conductivity type that is opposite to the conductivity type of semiconductor layer 12. In this example, body region 31 is p-type conductivity. Body region 31 has a dopant concentration suitable for forming inversion layers that operate as conduction channels or channel regions of transistor 10. Body region 31 extends from major surface 18 to a depth, for example, from about 0.5 microns to about 2.0 microns. Body region 31 is formed at this early stage of fabrication, or may be formed at later stages of fabrication, for example after the trench regions are formed. Conventional photolithographic, ion implantation, and anneal techniques are used to form body region 31 in select or desired areas, portions or regions of semiconductor substrate 13.

A dielectric stack, disposable dielectric stack, dielectric structure, or insulated stack 51 is formed overlying major surface 18, and in the embodiment shown includes dielectric layer 52 and dielectric layer 53, which are different materials. Specifically, dielectric layers 52 and 53 etch at different rates in a given etchant chemistry. That is, the layers have selectivity with respect to each other. In one embodiment, dielectric layer 52 is an oxide film, and has a thickness from about 0.1 microns to about 0.3 microns. In one embodiment, dielectric layer 52 is formed using thermal oxidation (i.e., wet oxidation or steam oxidation) techniques. In an alternative embodiment, dielectric layer 52 is formed using a chemical vapor deposition (CVD) process.

In one embodiment, dielectric layer 53 is a nitride film, and has a thickness from about 0.1 microns to about 0.3 microns. Dielectric layer 53 is formed using conventional techniques such as plasma enhanced or low pressure CVD process techniques. It is understood that dielectric stack 51 may include additional dielectric films. For example, a hard mask layer such as a deposited oxide may be formed overlying dielectric layer 53. Dielectric stack 51 includes a major, upper, or first surface 54 as shown in FIG. 1.

Figure 2:
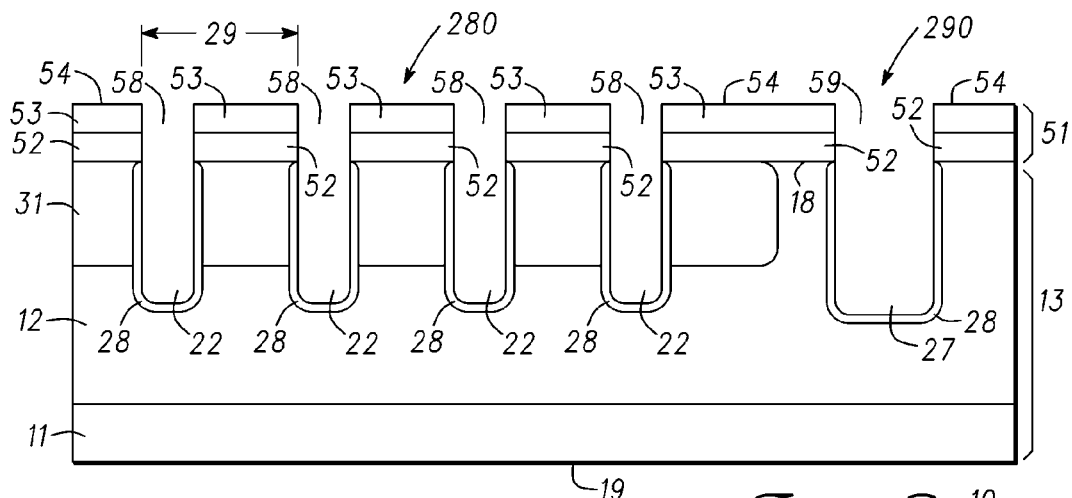

FIG. 2 shows transistor 10 at a subsequent step in its fabrication. A conventional photolithographic step and an etch step are used to form openings or windows 58 and 59 overlying major surface 18. Openings 58 and 59 extend through dielectric stack 51. Openings 58 correspond to locations where trench structures are to be formed in semiconductor substrate 13 in active area 280, and opening 59 corresponds to a location where a contact structure is to be formed in a termination or edge area 290. In the embodiment shown, the contact structure is for making contact to the insulated shield electrodes. Although not shown in this embodiment, a contact structure for making contact to the insulated gate electrodes can be formed as well in termination area 290. Openings 58 and 59 expose portions or segments of major surface 18. By way of example, openings 58 are about 0.25 microns to about 0.35 microns wide, and opening 59 is about 0.6 microns wide.

After openings 58 and 59 are formed, the exposed segments of semiconductor substrate 13 are etched to form trenches 22 and 27 extending from major surface 18. By way of example, trenches 22 and 27 are formed using plasma etching techniques with a fluorocarbon chemistry (e.g., SF$_6$/O$_2$). At this point in the process in accordance with the first embodiment, trenches 22 and 27 are etched to a first or an initial depth that extends just below body region 31. By way of example, this initial depth is about 0.8 microns to about 2.5 microns depending on the depth of body region 31. By way of example, transistor 10 has a pitch dimension 29 from about 0.8 microns to about 1.2 microns.

After trenches 22 and 27 are formed, a sacrificial oxide layer is formed overlying exposed surfaces of semiconductor substrate 13 in trenches 22 and 27. This step is used, for example, to clean-up the exposed surfaces. By way of example, a thermal oxide of about 0.08 microns is formed. Subsequently, the sacrificial oxide is removed. A dielectric layer 28 is then formed overlying exposed sidewall and lower surfaces of semiconductor substrate 13 in trenches 22 and 27. In one embodiment, dielectric layer 28 is configured as a gate dielectric film or layer, and is a thermal oxide having thickness from about 0.01 microns to about 0.1 microns. One feature of this step is that the gate dielectric layer is formed and the gate length for transistor 10 is established early in the process sequence, which, among other things, is beneficial to protect the critical dielectric-semiconductor material interface. In an alternative embodiment, the sacrificial oxide layer described above is left in place and used in the process sequence described below, and the gate dielectric layer is formed at a later step.

Figure 3:
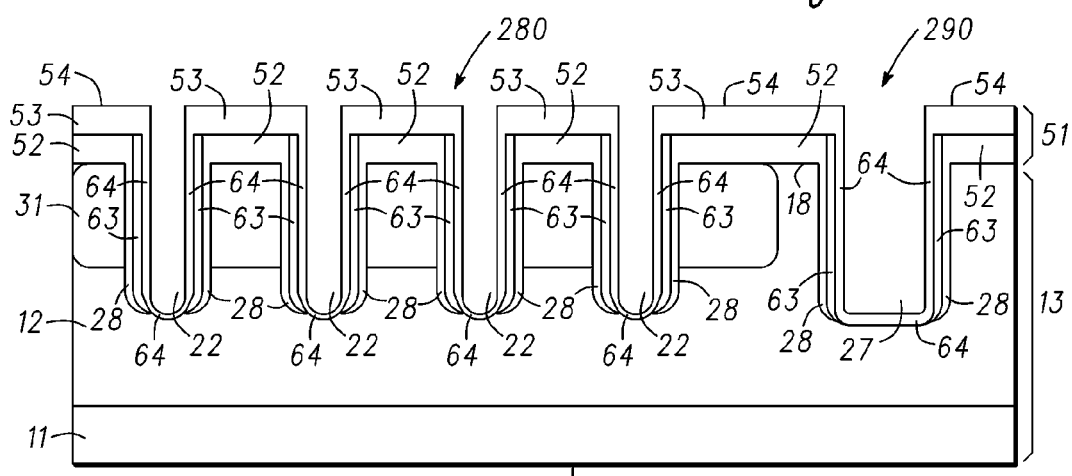

FIG. 3 shows transistor 10 after additional processing. A polycrystalline semiconductor layer 63 is formed overlying dielectric layer 28 and sidewalls of dielectric layer 52. By way of example, layer 63 comprises a polysilicon layer about 0.025 microns thick. An anisotropic etch is then used to remove segments of layers 63 and 28 from lower surfaces of trenches 22 and 27. A dielectric layer 64 then is formed overlying layer 63, lower surfaces of trenches 22 and 27, and sidewalls of dielectric stack 51. In one embodiment, dielectric layer 64 comprises a nitride layer, and has a thickness of about 0.025 microns.

Figure 4:
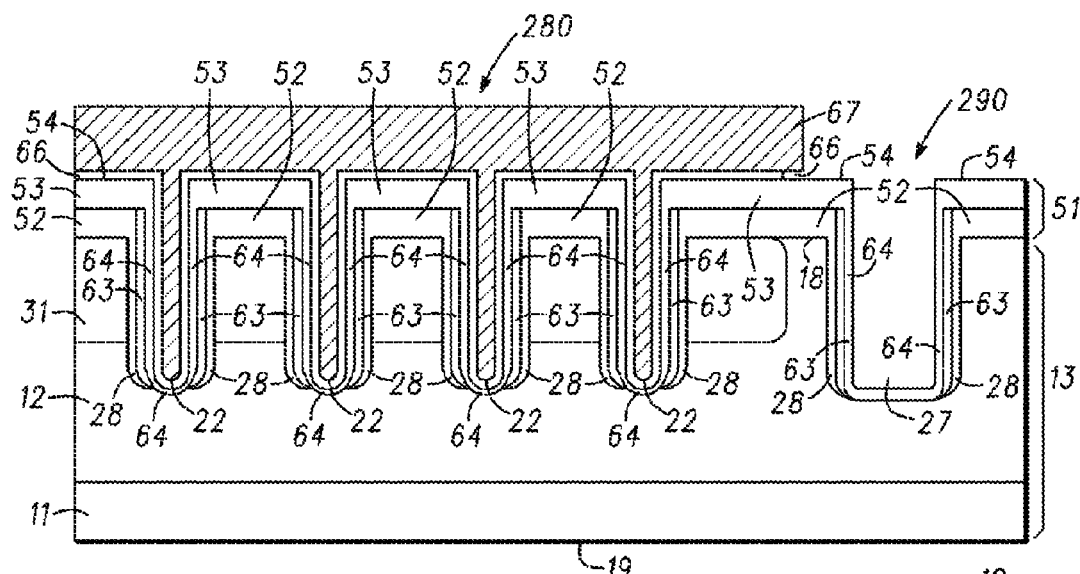
Figure 5:
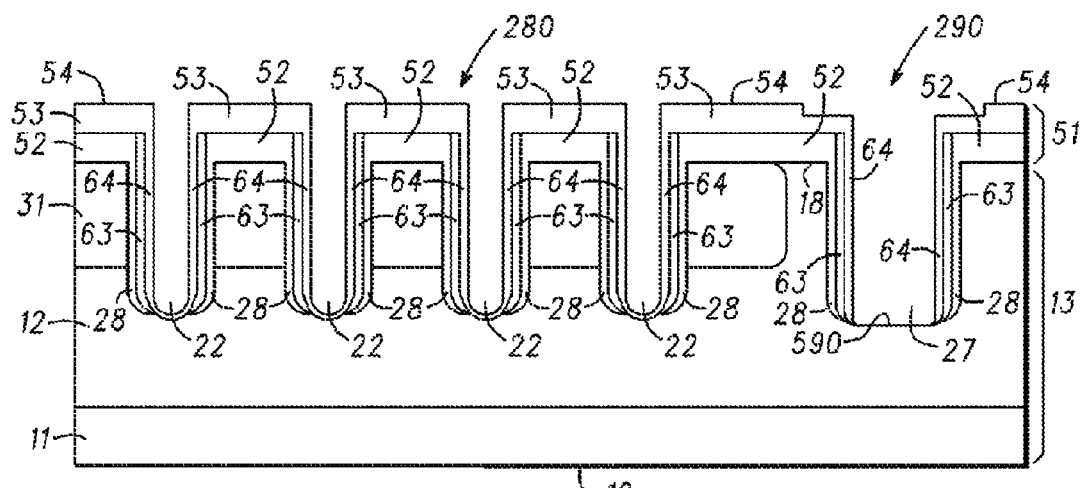

FIG. 4 shows transistor 10 after further processing. A dielectric layer 66 is formed overlying semiconductor substrate 13, and comprises, for example, about 0.05 microns of deposited oxide. A photo-resist layer 67 is then formed overlying semiconductor substrate 13 and then patterned to expose termination area 290 including trench 27. Dielectric layer 66 is then removed from termination area 290 thereby exposing dielectric layer 64 in trench 27 and segments of dielectric layer 53. Next, photo-resist layer 67 is removed, and dielectric layer 64 is removed from trench 27 to form opening 590 and expose a segment of semiconductor substrate 13 as shown in FIG. 5. This step may also thin portions of dielectric layer 53 in termination area 290 adjacent to trench 27. Dielectric layer 66 is then further removed from trenches 22 as shown in FIG. 5.

Figure 6:
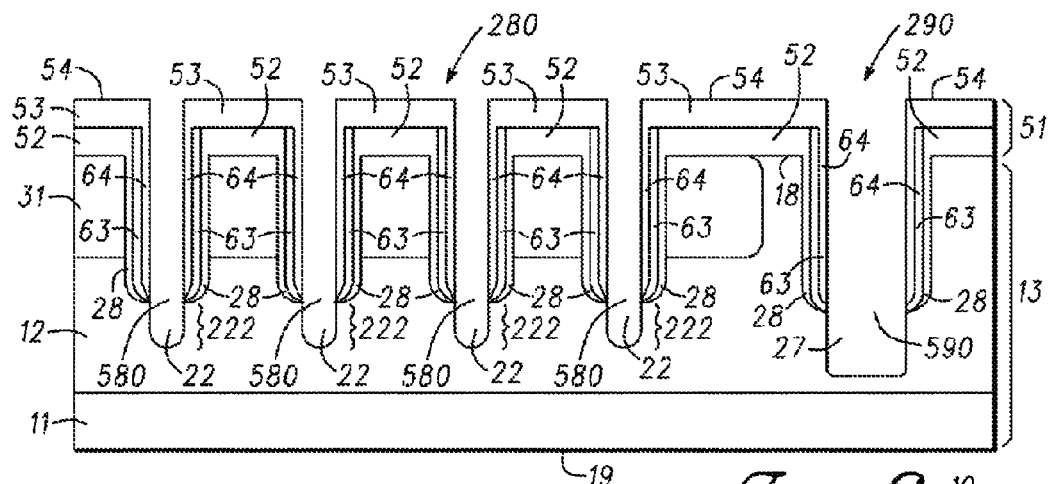
Figure 7:
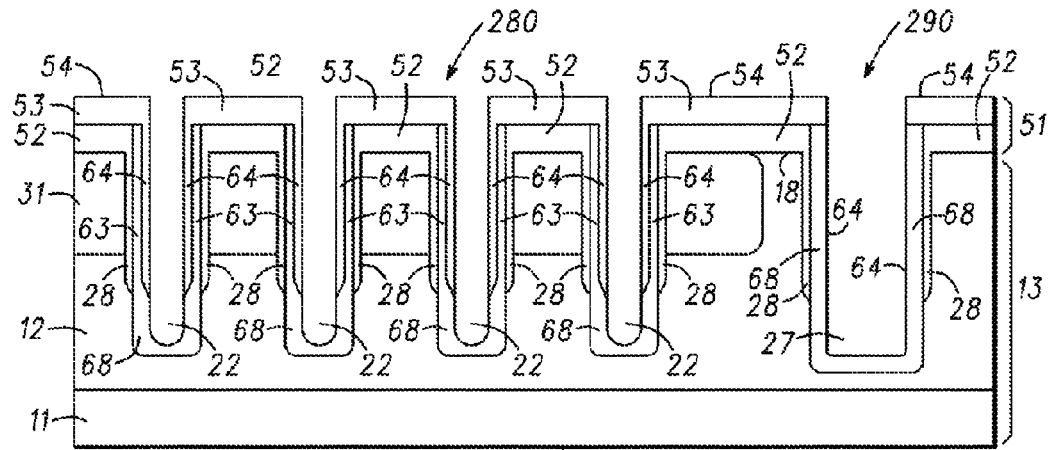

FIG. 6 shows transistor 10 after still further processing. An anisotropic dry etch is used to remove segments of dielectric layer 64 from lower surfaces of trenches 22 to form openings 580 while leaving other segments of dielectric layer 64 overlying layer 63. Trenches 22 and 27 are then etched deeper into semiconductor substrate 13 through openings 580 and 590 using, for example, a dry etch step with a fluorocarbon chemistry to form shield electrode trench portions 222. A dielectric layer, shield electrode insulating layer or field electrode insulating layer 68 is then formed along lower portions of trenches 22 (i.e., along shield electrode trench portions 222) and along surfaces of trench 27 as shown in FIG. 7. In one embodiment, dielectric layer 68 is a thermal oxide about 0.2 microns thick. Also, in this embodiment dielectric layer 68 is thicker than gate dielectric layer 28.

Figure 8:
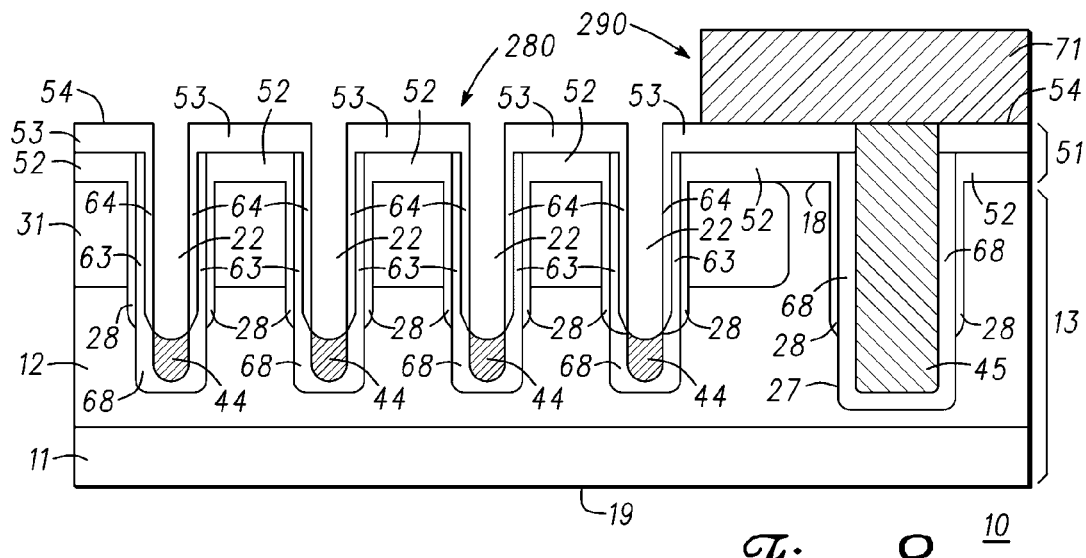

FIG. 8 shows transistor 10 after further processing. A conductive layer is deposited overlying semiconductor substrate 13. In one embodiment, the conductive layer is polysilicon doped with an n-type dopant such as phosphorous is suitable. In an alternate embodiment, the conductive layer is a metal, silicide, a or combinations thereof including combinations with polysilicon. The conductive layer is then planarized or etched back in proximity to surface 54 of dielectric stack 51. Either an etch back step or a chemical mechanical polishing or planarization (CMP) step is used. Next, a photo-resist layer is deposited and patterned to form a protective layer 71 overlying termination area 290 including trench 27. The conductive layer in trenches 22 is then partially etched-back and recessed within lower portions of trenches 22 leaving shield electrodes, conductive shield electrodes, or field electrodes 44 overlying dielectric layers 68 in lower portions of trenches 22. A dry etch process with a fluorocarbon chemistry is suitable for this step. A field electrode contact layer or region 45 remains in trench 27. Field electrodes 44 and dielectric layers 68 together with dielectric layer 74 (shown in FIG. 13) form insulated field electrodes or insulated shield electrodes 70 (also shown in FIG. 13) for transistor 10.

Figure 9:
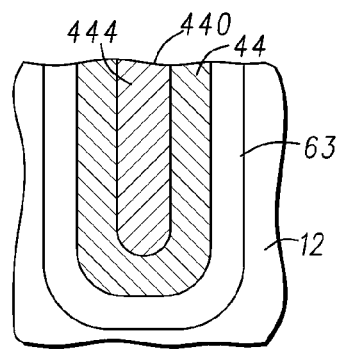
FIGS. 9-12 illustrate partial cross-sectional views of alternate embodiments of insulated shield electrodes.

Referring now to FIGS. 9-12, partial cross-sectional views of alternative embodiments for shield electrodes 44 are shown, which are configured for reducing resistance. In FIG. 9, shield electrode 44 further includes a metal or silicide region 444 that is substantially centrally located in field electrode 44, and extends from an upper portion 440 of field electrode 44. Region 444 comprises any metal or silicide material resilient to subsequent high temperature processing. To form region 444, a thinner conductive layer is formed in trenches 22, and the metal or silicide layer is formed overlying the conductive layer. The layers are then etched back to form the structure shown in FIG. 9 In FIG. 10, shield electrode 44 further includes a metal or silicide region 445 located at a lower portion 441 of shield electrode 44. In this embodiment, region 445 is first formed in lower portions of trenches 22, and shield electrode 44 is then formed overlying region 445.

Figure 11:
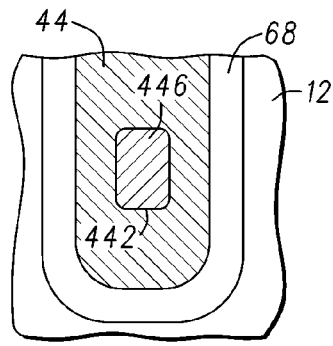
Figure 10:
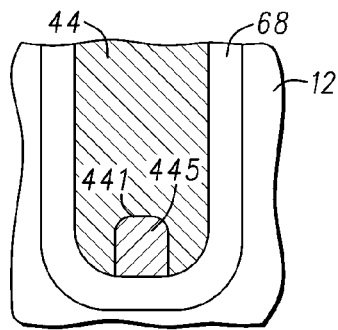
Figure 12:
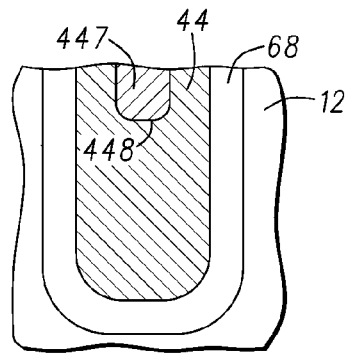

In FIG. 11, shield electrode 44 is formed surrounding a metal or silicide region 446. Region 446 is formed similarly to region 444 except that region 446 is recessed further than shield electrode 44, and additional material such as doped polysilicon is formed overlying region 446. In FIG. 12, shield electrode 44 further includes a metal or silicide region 447 located at an upper portion 448 of shield electrode 44. Region 447 is formed similarly to region 444 except that the conductive layer in this embodiment is thicker than the conductive layer in the embodiment of FIG. 9. Regions 444, 445, 446, and 447 are configured to reduce resistance, which, among other things, improves switching performance.

Figure 13:
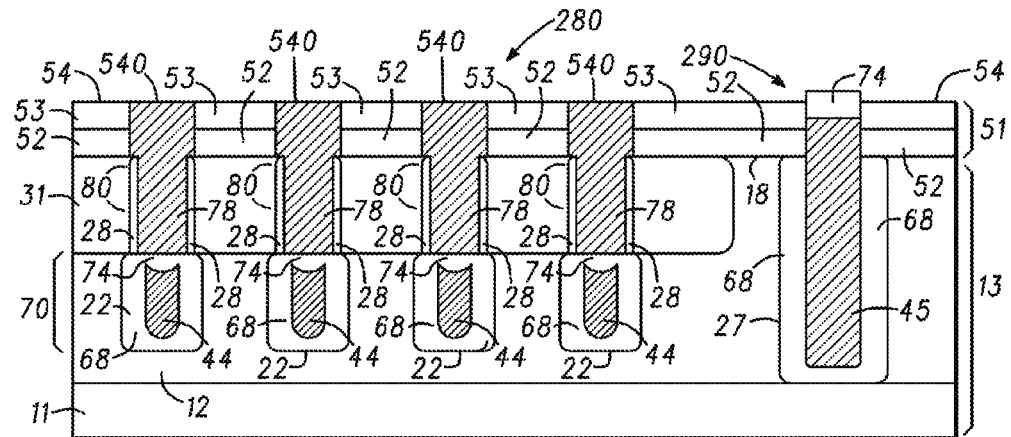
FIGS. 13-20 illustrate partial cross-sectional views of the IGFET device FIGS. 1-8 during subsequent stages of fabrication.

FIG. 13 shows transistor 10 after additional processing. Dielectric layer or shield electrode insulating layer 74 is first formed overlying shield electrodes 44 and conductive shield electrode contact region 45. In one embodiment, dielectric layer 74 is an oxide such as thermal oxide, and has a thickness of about 0.1 microns. Dielectric layer 64 is then removed from sidewall segments of trenches 22 using, for example, a selective etch.

A conductive layer is then formed overlying semiconductor substrate 13 and overlying insulated shield electrodes 70 within trenches 22. In one embodiment, the conductive layer is polysilicon, and in the present embodiment is doped with an n-type dopant such as phosphorous. In an alternate embodiment, the conductive layer is a metal, silicide or combinations thereof including combinations with polysilicon. Portions of the conductive layer are then removed to form or provide conductive gate material, electrodes or layers 78 within trenches 22. In the present embodiment, the conductive layer is then planarized so that upper surfaces 540 of conductive gate electrodes 78 are in proximity to upper surfaces 54 of dielectric stack 51. An etch-back step or a CMP step is used for this planarization step. Conductive gate electrodes 78, dielectric layer 28, and dielectric layer 74 form insulated gate electrodes 80 for transistor 10.

Figure 14:
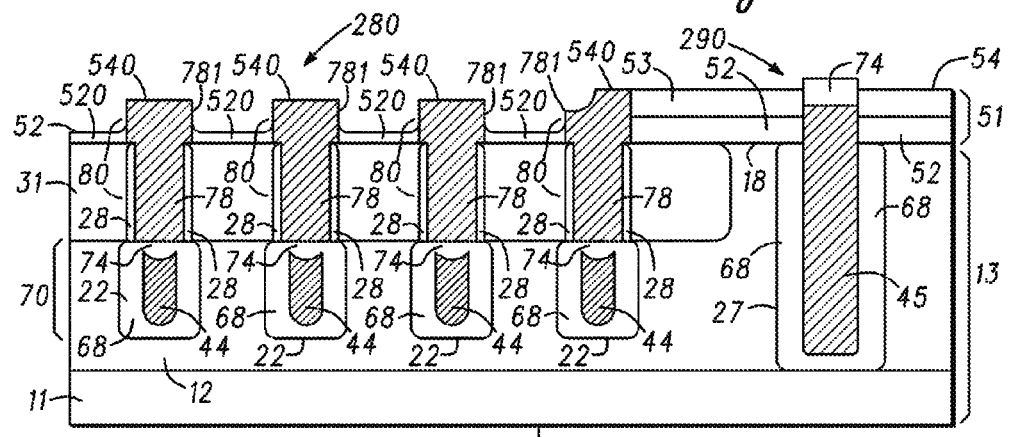

FIG. 14 shows transistor 10 at a later step in fabrication. A photo-resist layer (not shown) is formed overlying semiconductor substrate 13 and patterned to leave the photo-resist layer overlying termination area 290. Next, transistor 10 is exposed to a dry etch step to remove dielectric layer 53 and dielectric layer 52 from dielectric stack 51 in active area 280. A fluorine based chemistry is suitable for this step. A residual portion 520 of dielectric layer 52 may remain as shown in FIG. 14, or all dielectric layer 52 is removed. After this step, portions 781 of gate electrodes 80 remain extending away from, outward from, or above major surface 18. The photo-resist layer overlying termination area 290 is then removed.

Figure 15:
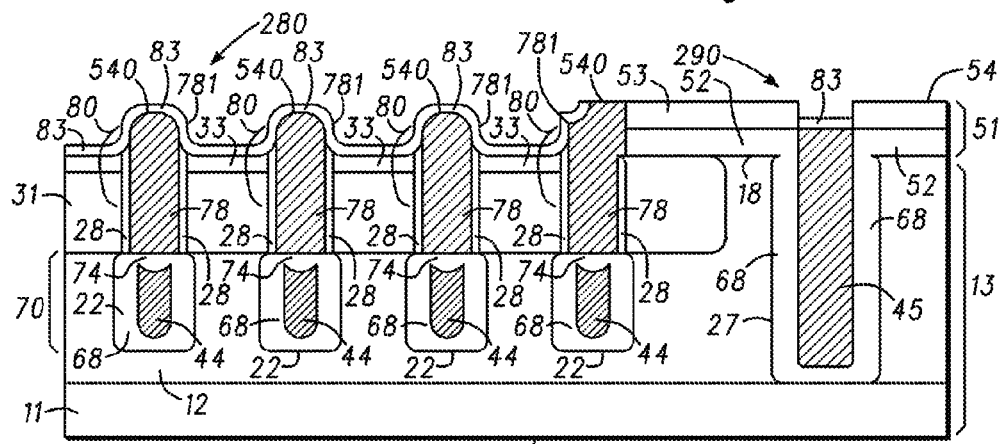

Next, any residual portions 520 of dielectric layer 52 and dielectric layer 74 overlying shield electrode contact region 45 are removed in a wet strip process as shown in FIG. 15. A screen dielectric layer 83 is then formed overlying portions 781 of gate electrodes 78 and segments of major surface 18 between trenches 22. In one embodiment, screen dielectric layer 83 is an oxide formed using thermal oxidation techniques, and has a thickness of about 0.05 microns. Next, n-type source regions, current conducting regions, or current carrying regions 33 are formed within, in, or overlying body regions 31 and extend from major surface 18 to a depth, for example, from about 0.1 microns to about 0.5 microns. A phosphorous or arsenic ion implant dose of about $3.0 \times 10^{15}$ atoms/cm$^2$ and an implant energy sufficient to allow the dopant to penetrate screen dielectric layer 83 is used to form source regions 33. The implanted dopant is then annealed at this point or during subsequent processing.

Figure 16:
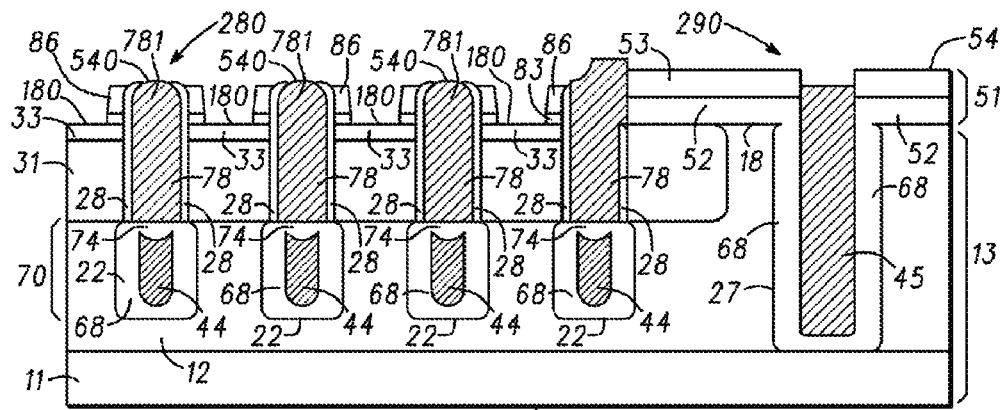

FIG. 16 shows transistor 10 at a still further step in fabrication. A dielectric layer is formed overlying semiconductor substrate 13, and subsequently anisotropically etched to form spacers 86 next to or adjacent to portions 781 of gate electrodes 78. This etch step also exposes upper surfaces 540 of gate electrodes 78 as well as segments 180 of major surface 18 between adjacent trenches 22. In one embodiment, the dielectric layer is a nitride layer with a thickness of about 0.2 microns to about 0.3 microns.

Figure 17:
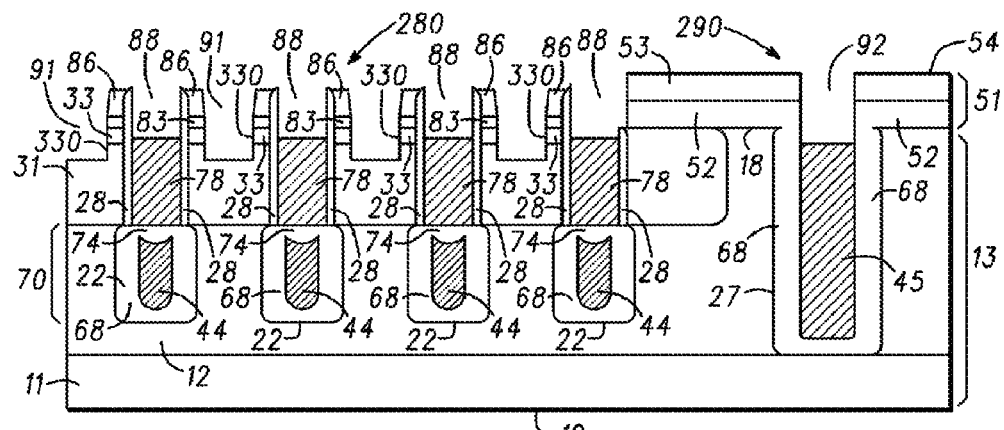

In accordance with the present embodiment, a dry etch step is used to remove portions of gate electrodes 78 adjacent to spacers 86, and to remove portions of semiconductor substrate 13 self-aligned to spacer 86 as shown in FIG. 17. This step forms recessed portions 88 overlying conductive gate electrodes 78, recessed portions 91 within semiconductor substrate 13 or specifically within body region 31, and recessed portion 92 overlying shield electrode contact region 45. Recessed portions 91 extend into body region 31 exposing surfaces 330 of source regions 33. Recessed portions 88 are formed so that conductive gate electrodes 78 remain above the junction between source regions 33 and body region 31. In one embodiment, recessed portions 88, 91, and 92 are formed using a dry etch process with an $SF_6/O_2$ chemistry. Alternatively, an HBr/Cl chemistry is used.

Figure 18:
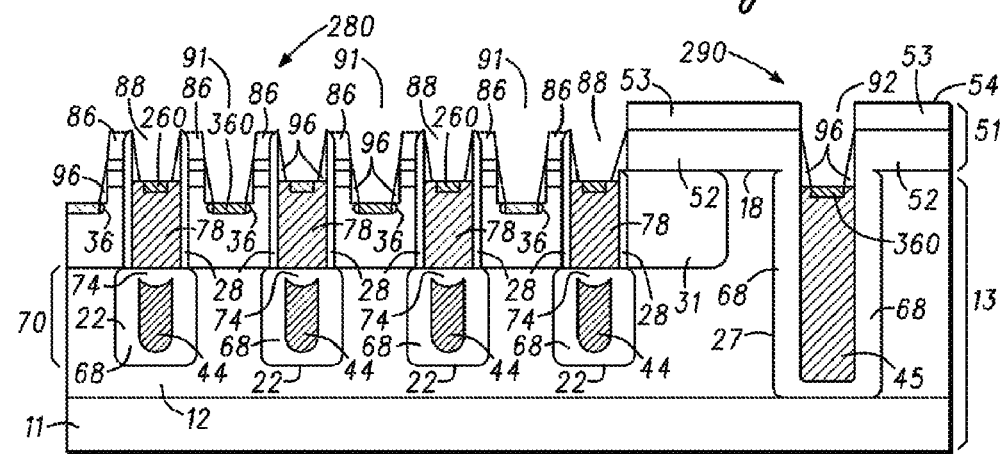

FIG. 18 shows transistor 10 after additional processing. A dielectric layer or spacer layer is formed overlying semiconductor substrate 13. In one embodiment, the dielectric layer is a deposited oxide and has a thickness of about 0.05 microns. The dielectric layer is then anisotropically etched to form spacers 96 within recessed portions 88, 91, and 92. P-type dopant is then ion implanted into body region 31 to form contact enhancement regions 36, which are self-aligned to spacers 96. In one embodiment, a boron ion implant or a series of boron ion implants is/are used to form contact enhancement regions 36. By way of example when a single implant is used, an implant dose of about $1.0 \times 10^{14}$ atoms/cm$^2$ to about $2.0 \times 10^{15}$ atoms/cm$^2$ is used. Next, the implanted dopant is annealed. Although boron is also implanted into conductive gate electrodes 78 and shield electrode contact region 45, the implant dose is not sufficient to compensate the n-type dopant already present, thus p-type regions are not formed in these regions.

Enhancement regions 360 are then formed in conductive gate electrodes 78, shield electrode contact region 45, and contact enhancement regions 36. Enhancement regions 360 are also self-aligned to spacers 96. In one embodiment, enhancement regions 360 are self-aligned silicide or salicide regions such as titanium silicide or a cobalt silicide, and are formed using conventional silicide formation techniques.

In accordance with the present embodiment, spacers 96 provide a couple of benefits. Specifically, they eliminate or reduce any potential silicide-to-gate edge interaction, and secondly, spacers 96 move enhancement regions 36 and 360 further away from the gate edge area thereby reducing any potential for current crowding issues and minimizing any detrimental impact on the threshold voltage of transistor 10.

Figure 19:
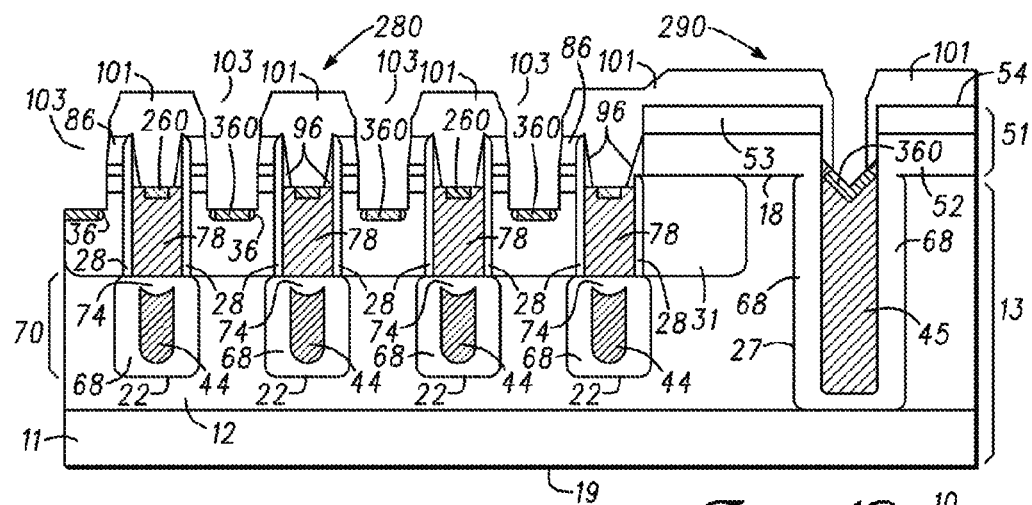

FIG. 19 shows transistor 10 after additional processing. An inter-layer dielectric (ILD) film is formed overlying semiconductor substrate 13, planarized and photolithographically patterned to form ILD regions 101 and contact openings 103. In the present embodiment, the ILD film is a deposited silicon oxide doped with phosphorous or boron and phosphorous, and has a thickness from about 0.4 microns to about 1.0 micron. Preferably, the inter-layer dielectric film is planarized to provide a more uniform surface topography, which improves manufacturability. Preferably, the ILD film comprises a material that is different than the material used for spacers 86, which allows a selective etch to be used for the subsequent contact etch. In this case, spacers 86 beneficially enable a partial self-alignment feature for contact openings 103.

Figure 20:
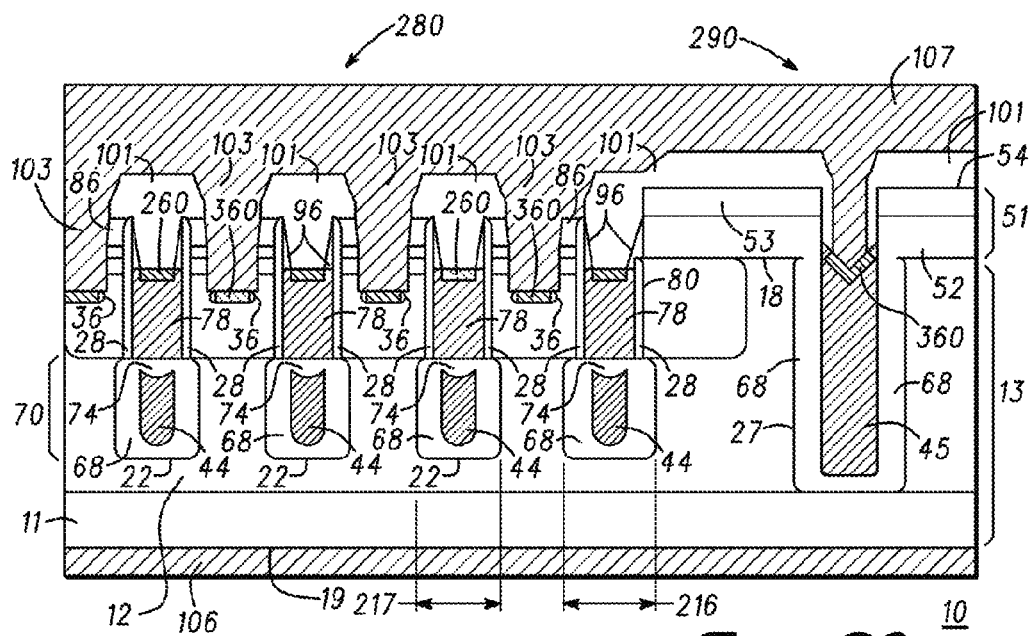

Next, contact structures are formed overlying major surfaces 18 and 19 of transistor 10 as shown in FIG. 20. Contact layer 106 is formed overlying major surface 19 and is a metal layer such as Ti/Ni/Ag, Cr/Ni/Au, or the like. In transistor 10, contact layer 106 is configured as a drain contact or drain electrode. Contact structure 107 is formed overlying major surface 18 and provides electrical contact to enhancement regions 36/360 in body region 31, source regions 33, field electrode contact region 45, and indirectly to shield electrodes 44. In one embodiment, contact structure 107 includes a Ti/TiN barrier layer as the first contact layer, tungsten plugs overlying the Ti/TiN barrier layer, and an aluminum alloy overlying the tungsten plugs. In transistor 10, contact structure 107 is configured as a source contact or source electrode. In a final step, a passivating layer is then formed overlying contact structure 107 and patterned to provide contact areas for source wire bonds or other connective structures. Although not shown, another contact structure is formed overlying major surface 18 to provide contact to gate electrodes 78 in termination area 290. Another feature of the method in accordance with the present embodiment is that it provides insulated shield electrodes 70 that have a lateral width or dimension 216 this is greater than lateral width or dimension 217 of insulated gate electrodes 80.

In one embodiment, the operation of transistor 10 proceeds as follows. Assume that source electrode (or input terminal) 107 and shield electrodes 44 are operating at a potential $V_S$ of zero volts, gate electrodes 78 receive a control voltage $V_G$ of 2.5 volts, which is greater than the conduction threshold of transistor 10, and drain electrode (or output terminal) 106 operates at a drain potential $V_D$ of 5.0 volts. The values of $V_G$ and $V_S$ cause body region 31 to invert adjacent conductive gate electrodes 78 to form channels, which electrically connect source regions 33 to semiconductor layer 12. A device current $I_{DS}$ flows from drain electrode 106 and is routed through semiconductor layer 12, the channels, and source regions 33 to source electrode 107. In one embodiment, $I_{DS}$ is on the order of 1.0 amperes. To switch transistor 10 to the off state, a control voltage $V_G$ of less than the conduction threshold of transistor 10 is applied to gate electrodes 78 (e.g., $V_G$<2.5 volts). This removes the channels and $I_{DS}$ no longer flows through transistor 10.

Shield electrodes 44 are configured to control the width of the depletion layer between body region 31 and semiconductor layer 12, which enhances source-to-drain breakdown voltage. Also, shield electrodes 44 help reduce gate-to-drain charge of transistor 10. Additionally, because there is less overlap of conductive gate electrodes 78 with semiconductor layer 12 compared to other structures, the gate-to-drain capacitance of transistor 10 is reduced. These features further enhance the switching characteristics of transistor 10.

Figure 21:
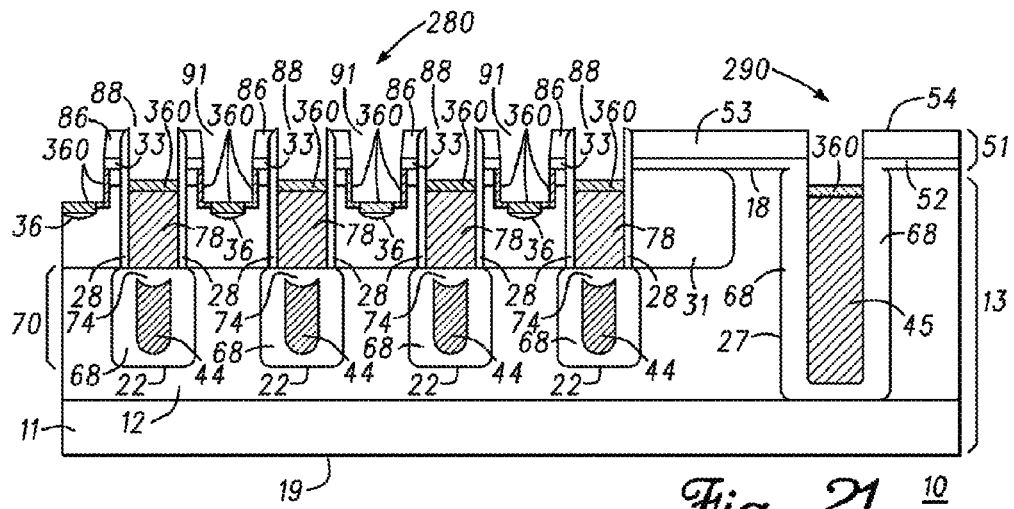
FIG. 21 illustrates a partial cross-sectional view of another embodiment of an IGFET device.

FIG. 21 shows an alternative embodiment for transistor 10. In this embodiment, spacers 96 are not used as shown in FIG. 18, and enhancement regions 360 are further formed along sidewall portions of recessed regions 91 adjacent to body region 31 and source regions 33. One benefit of this alternative embodiment is that enhanced contact is made to body region 31 and source regions 33.

FIGS. 22-26 show an alternative method forming a transistor 100 having an insulated shield electrode and an insulated gate electrode similar to transistor 10. However, in contrast to transistor 10, the method used to form transistor 100 etches trenches 22 and 27 to their target depth in one step, and the insulated gate electrodes and the insulated shield electrodes have approximately the same lateral width.

Figure 22:
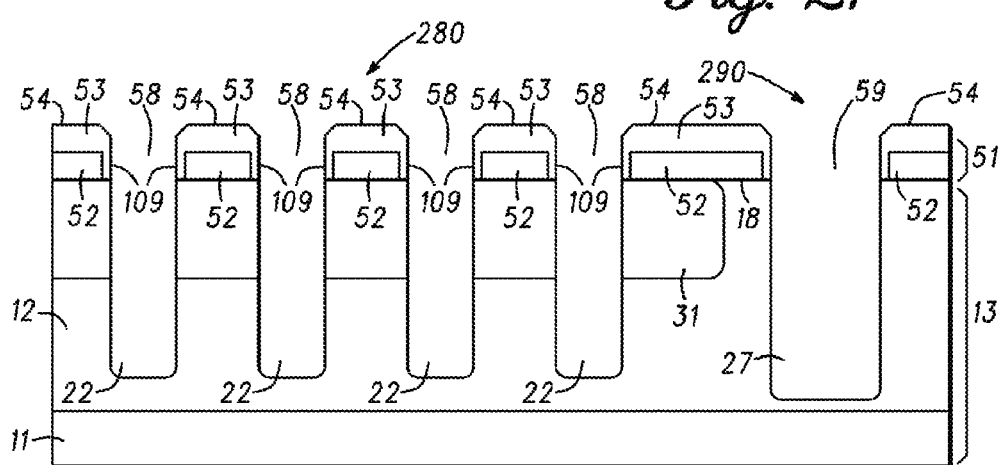
FIGS. 22-26 illustrate partial cross-sectional views of a further embodiment of an IGFET device at early stages of fabrication.

FIG. 22 shows transistor 100 after dielectric stack 51 is formed overlying major surface 18 of semiconductor substrate 13. Openings 58 and 59 are formed, but prior to etching trenches 22 and 27, an optional dielectric layer is formed overlying semiconductor substrate 13 and anisotropically etched to form spacers 109. In one embodiment, spacers 109 are silicon nitride and have a thickness of about 0.05 microns. After spacers 109 are formed, trenches 22 and 27 are formed extending from major surface 18 and are self-aligned to spacers 109. As stated above, trenches 22 and 27 are etched in this embodiment to their final target depth at this step in fabrication.

Figure 23:
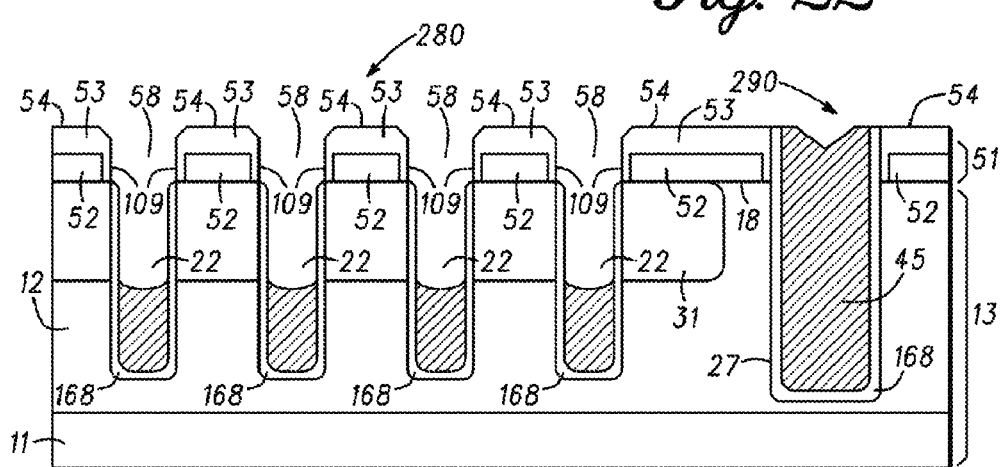

Next, a dielectric layer 168 is formed overlying surfaces of trenches 22 and 27 as shown in FIG. 23. In one embodiment, dielectric layer 168 is an oxide such as a wet oxide and has a thickness of about 0.1 microns. A conductive layer is then formed overlying semiconductor substrate 13 followed by a photo-resist layer that is patterned to leave a portion of the photo-resist layer covering termination area 290. Portions of the conductive layer are then removed from trenches 22 thereby leaving shield electrodes 44 in lower portions of trenches 22. In one embodiment, shield electrodes 44 comprise doped polysilicon. In the alternative, shield electrodes 44 comprise a metal or silicide or may comprise the embodiment shown and described in FIGS. 9-12. After shield electrodes 44 are formed, the photo-resist layer is removed. Shield electrode contact region 45 remains in the trench 27.

Figure 24:
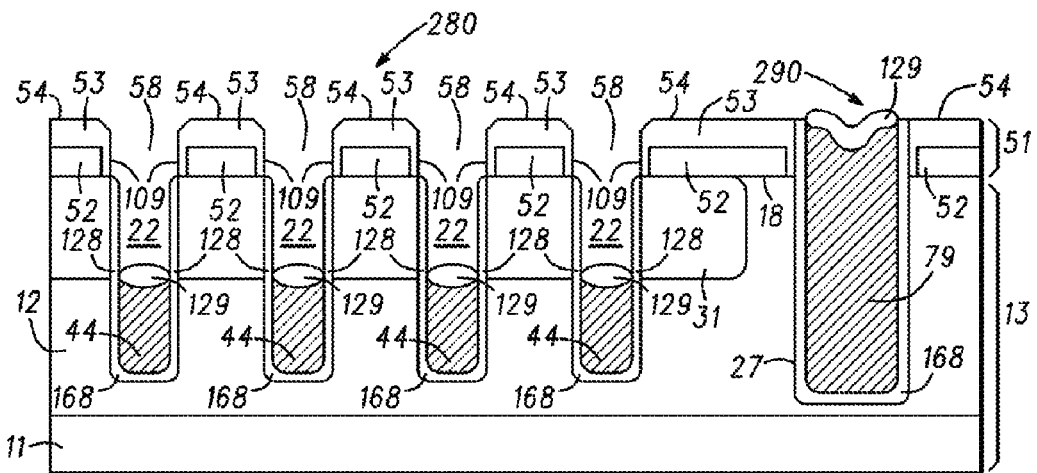

FIG. 24 shows transistor 100 at a later step in fabrication. An optional step is used to remove any residual conductive material remaining overlying exposed surfaces of dielectric layer 168 in trenches 22. When the conductive layer comprises polysilicon, a wet oxide of less than about 0.1 microns is formed in trenches 22 for this optional step. This oxide and those portions of dielectric 168 along sidewalls of trenches 22 above shield electrodes 44 are removed. Next, the exposed surfaces of semiconductor substrate 13 in trenches 22 are cleaned, and a dielectric layer 128 is formed overlying the exposed surfaces of trenches 22. Also, a dielectric layer 129 is formed overlying shield electrodes 44. Dielectric layer 128 is configured as a gate dielectric layer for transistor 100. In one embodiment, dielectric layer 128 is an oxide and has thickness between about 0.01 microns to about 0.1 microns. Although dielectric layer 129 is formed at the same time as dielectric 128, it is typically thicker than dielectric layer 128 when shield electrodes 44 are polysilicon because of the faster growth rates associated with the oxidation of polysilicon.

Figure 25:
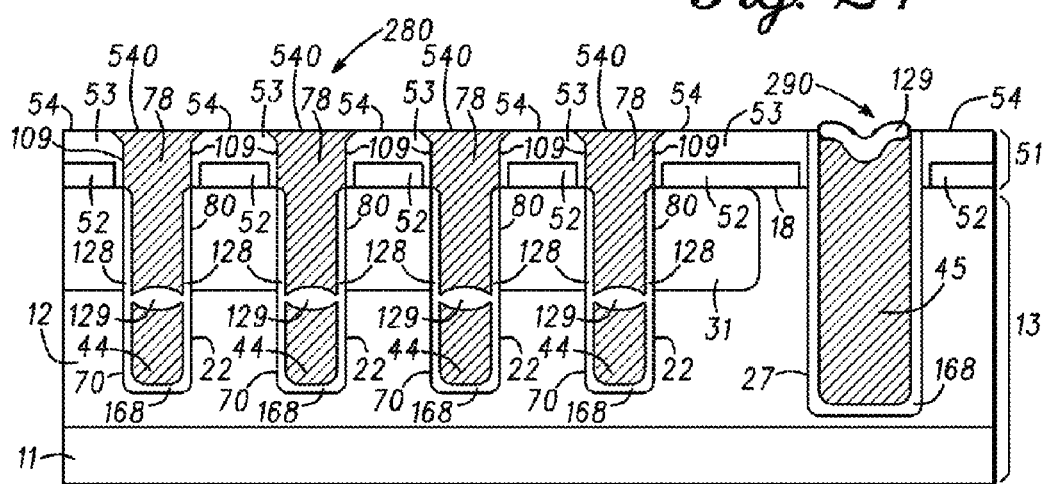

FIG. 25 shows transistor 100 after additional processing. A conductive layer is formed overlying semiconductor substrate 13 and planarized to form gate conductive electrodes 78, which comprise materials described previously. Gate conductive electrodes 78 have an upper surface 540 in proximity to upper surface 54 of dielectric stack 51. Photo-resist/etch back or CMP techniques are used to planarize the conductive layer to form gate conductive electrodes 78. Gate conductive electrodes 78, dielectric layers 128 and dielectric layers 129 form insulated gate electrodes 80, and shield electrodes 44, dielectric layers 168 and 129 form insulated shield electrodes 70.

Figure 26:
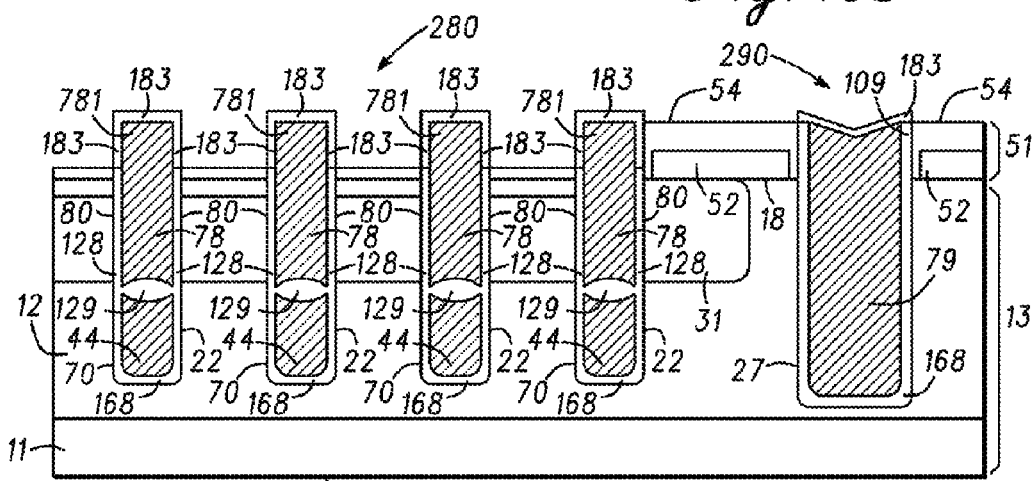

Next, a photo-resist layer (not shown) is formed overlying semiconductor substrate 13 and patterned to leave portions of the photo-resist layer covering termination area 290. Dielectric layers 53 and 109 in active area 280 are then removed and the photo-resist layer is then stripped. Dielectric layer 52 in active area 280 is then removed as shown in FIG. 26. After this step, portions 781 of insulated gate electrodes 80 remain extending away from or above major surface 18. Screen dielectric layer 183 is then formed overlying exposed segments of semiconductor substrate 13 between trenches 22 and overlying gate conductive electrodes 78 and shield electrode contact layer 45. In one embodiment, screen dielectric layer 183 is an oxide about 0.03 microns to about 0.1 microns thick. Next, source regions 33 are formed in body region 31. At this point, the processing of transistor 100 continues in accordance with FIGS. 16-21 and the associated description.

In view of all of the above, it is evident that a novel method is disclosed for forming a transistor having insulated shield electrode regions and insulated gate electrode regions. Included, among other features, is using a disposable dielectric stack to form the insulated gate electrode regions, removing the disposable dielectric stack, and then forming a first set of spacers adjacent the insulated gate electrode regions. Further included is using the first set of spacers to form first recessed regions in the insulated gate electrode regions, and second recessed regions in the semiconductor substrate, and then forming enhancement regions in the first and second recessed regions. In a further embodiment, the method includes forming a second set of spacers in the first and second recessed regions, and forming the enhancement regions self-aligned to the second set of spacers. The disposable dielectric stack enables the formation of the first set of spacers adjacent the insulated gate electrode regions, which provides a self-aligned contact area to the transistor. The first set of spacers also provides for the formation of the recessed portions late in the process, which enables the use of salicide enhancement regions.

The method further includes using disposable dielectric spacer layers during trench formation, which reduces photolithographic requirements and enables the use of multiple oxidation and wet strip cycles within the trenches. This improves process control, flexibility, and manufacturability.

While the subject matter of the invention is described with specific preferred embodiments, it is evident that many alternatives and variations will be apparent to those skilled in the semiconductor arts. More specifically the subject matter of the invention has been described for a particular N-channel MOS transistor structure on a silicon substrate, although the method is directly applicable to other transistors formed on other semiconductor materials, as well as to BiCMOS, metal semiconductor FETs (MESFETs), HFETs, IGBTs, and other transistor structures.

What is claimed is:

1. A method of forming a semiconductor device comprising the steps of:

providing a semiconductor substrate having a major surface;

forming a dielectric stack overlying the major surface, wherein the dielectric stack comprises at least two layers of different material, and wherein the dielectric stack has a first surface;

forming first openings in the dielectric stack;

forming trenches in the semiconductor substrate through the first openings to a first depth;

forming insulated shield electrodes in lower portions of the trenches;

forming insulated gate electrodes in the trenches above the insulated shield electrodes, wherein the insulated gate electrodes comprise a conductive gate material having upper surfaces in proximity to the first surface;

removing at least portions of the dielectric stack thereby leaving portions of the conductive gate material extending above the major surface;

forming first spacers adjacent to the portions of the conductive gate material, wherein segments of the major surface are exposed between adjacent trenches;

removing portions of conductive gate material and portions of the semiconductor substrate self-aligned to the first spacers, wherein the removing step forms first recessed portions overlying the conductive gate material, and second recessed portions within the semiconductor substrate;

forming second spacers in the first and second recessed portions;

forming enhancement regions in the first and second recessed portions self-aligned to the second spacers;

forming insulating regions overlying the first recessed portions; and forming a first conductive layer coupled to the semiconductor substrate through the second recessed portions.

2. The method of claim 1, wherein the step of forming the insulated shield electrodes comprises the steps of:

forming a first dielectric layer overlying surfaces of the trenches, wherein the first dielectric layer has a first thickness;

forming a second dielectric layer overlying the first dielectric layer, wherein the first dielectric layer and the second dielectric layer comprise different materials;

forming second openings along lower portions of the trenches through the first and second dielectric layers;

forming the trenches to a second depth greater than the first depth through the second openings to form shield electrode trench portions;

forming a third dielectric layer along surfaces of the shield electrode trench portions, wherein the third dielectric layer has a second thickness;

forming shield electrodes overlying the third dielectric layer, wherein the shield electrodes are recessed within the trenches; and forming a fourth dielectric layer overlying the shield electrodes.

3. The method of claim 2, wherein the step of forming the third dielectric layer includes forming the third dielectric layer, wherein the second thickness is greater than the first thickness.

4. The method of claim 2, wherein the step of forming the first dielectric layer includes forming an oxide layer, and wherein the step of forming the second dielectric comprises forming a nitride layer.

5. The method of claim 2, wherein the step of forming the insulated gate electrodes comprises the steps of:

removing remaining portions of the second dielectric layer after the step of forming the fourth dielectric layer; and forming the gate conductive material overlying the fourth and first dielectric layers.

6. The method of claim 2, wherein the step of forming the shield electrodes includes forming the shield electrodes comprising polysilicon and a silicide.

7. The method of claim 6, wherein the step of forming the shield electrodes includes forming the shield electrodes, wherein the polysilicon surrounds the silicide.

8. The method of claim 2, wherein the step of forming the shield electrodes includes forming the shield electrodes comprising a metal.

9. The method of claim 2 further comprising the step of forming a polysilicon layer overlying the first dielectric layer before the step of forming the second dielectric layer.

10. The method of claim 1, wherein the step of forming the enhancement regions including forming silicide regions.

11. The method of claim 1, wherein the step of forming the dielectric stack comprises the steps of:

forming a first layer comprising an oxide; and forming a second layer comprising a nitride overlying the first layer.

12. The method of claim 1, wherein the step of providing the semiconductor substrate includes providing a semiconductor substrate comprising a first conductivity type, and wherein the method further comprises the step of forming a body region within the semiconductor substrate, wherein the body region and the insulated gate electrodes are adjacent, and wherein the body region comprises a second conductivity type opposite to the first conductivity type.

13. The method of claim 12, wherein the body region is formed prior the step of forming the trenches.

14. The method of claim 12, wherein the body region is formed after the step of forming the trenches.

15. The method of claim 1, wherein the step of forming the first conductive layer includes forming conductive plug regions.

16. The method of claim 1, wherein the step of removing at least portions of the dielectric stack includes the steps of:

removing all of the dielectric stack; and exposing conductive gate material above the major surface.

17. A method for forming a semiconductor device comprising the steps of:

providing a semiconductor substrate having a major surface, a pair of adjacent trenches, and a dielectric stack overlying the major surface between the pair of adjacent trenches, wherein each trench includes an insulated gate electrode portion including a gate electrode layer formed with first surface in proximity to an upper surface of the dielectric stack;

removing the dielectric stack along side surfaces of the insulated gate electrode above the major surface;

forming first spacers adjacent the side surfaces;

removing a portion of the gate electrode layer adjacent the first spacers to form a first recessed portion;

removing a portion of the semiconductor substrate to form a second recessed portion self-aligned to the first spacers; and forming enhancement regions within the first and second recessed portions.

18. The method of claim 17, wherein the step of providing the semiconductor substrate further includes providing a semiconductor substrate of a first conductivity type with a body region of a second conductivity type formed between adjacent trenches and source regions formed within the body region, the method of forming the enhancement regions includes forming the enhancement regions along side surfaces of the second recessed portions adjoining the source regions.

19. The method of claim 17 further comprising the step of forming second spacers within the first and second recessed portions before the step of forming the enhancement regions, and wherein the step of forming the enhancement regions includes forming the enhancement regions self-aligned to the second spacers.

20. The method of claim 17, wherein the step of providing the semiconductor substrate includes providing a semiconductor substrate, wherein each trench includes an insulated shield electrode portion underlying the insulated gate electrode portion.

21. A method for forming a semiconductor device comprising the steps of:

providing a semiconductor substrate having a major surface, a pair of adjacent trenches, and a dielectric stack overlying the major surface between the pair of adjacent trenches, wherein each trench includes an insulated gate electrode portion including a gate electrode layer and an insulated shield electrode portion underlying the insulated gate electrode portion;

removing the dielectric stack along side surfaces of the insulated gate electrode above the major surface;

forming first spacers adjacent the side surfaces;

removing a portion of the gate electrode layer adjacent the first spacers to form a first recessed portion;

removing a portion of the semiconductor substrate to form a second recessed portion self-aligned to the first spacers;

forming second spacers within the first and second recessed portions and forming enhancement regions within the first and second recessed portions self-aligned to the second spacers.

22. The method of claim 21, wherein the step of providing the semiconductor substrate includes providing the semiconductor substrate, wherein at least one insulated shield electrode portion has a wider lateral dimension than that of at least one insulated gate electrode portion.

* * * * *

UNITED STATES PATENT AND TRADEMARK OFFICE
CERTIFICATE OF CORRECTION

PATENT NO. : 8,021,947 B2
APPLICATION NO. : 12/633947
DATED : September 20, 2011
INVENTOR(S) : Gordon M. Grivna et al.

It is certified that error appears in the above-identified patent and that said Letters Patent is hereby corrected as shown below:

In the drawings, Sheet 6, Fig. 18, and Sheet 7, Fig. 19 and Fig. 20, the reference numeral "260", each occurrence, should read --360--.

Signed and Sealed this
Ninth Day of July, 2013

Teresa Stanek Rea
*Acting Director of the United States Patent and Trademark Office*